(12) United States Patent
Chung et al.

(10) Patent No.: US 9,142,414 B2
(45) Date of Patent: Sep. 22, 2015

(54) CMOS DEVICES WITH METAL GATES AND METHODS FOR FORMING THE SAME

(75) Inventors: Sheng-Chen Chung, Jhubei (TW); Ming Zhu, Singapore (SG); Harry-Hak-Lay Chuang, Singapore (SG); Bao-Ru Young, Zhubei (TW); Wei-Cheng Wu, Zhubei (TW); Chia Ming Liang, Taipei (TW); Sin-Hua Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 179 days.

(21) Appl. No.: 13/331,214

(22) Filed: Dec. 20, 2011

(65) Prior Publication Data

US 2013/0154022 A1    Jun. 20, 2013

(51) Int. Cl.
| | |
|---|---|
| H01L 21/28 | (2006.01) |
| H01L 21/8238 | (2006.01) |
| H01L 29/49 | (2006.01) |
| H01L 29/51 | (2006.01) |
| H01L 29/66 | (2006.01) |
| H01L 29/78 | (2006.01) |

(52) U.S. Cl.
CPC .. *H01L 21/28088* (2013.01); *H01L 21/823807* (2013.01); *H01L 21/823842* (2013.01); *H01L 21/823857* (2013.01); *H01L 29/4966* (2013.01); *H01L 29/6659* (2013.01); *H01L 29/66545* (2013.01); *H01L 29/513* (2013.01); *H01L 29/517* (2013.01); *H01L 29/665* (2013.01); *H01L 29/7833* (2013.01); *H01L 29/7843* (2013.01); *H01L 29/7848* (2013.01)

(58) Field of Classification Search
CPC .................................................. H01L 29/66545
USPC ......................................... 438/592, 652, 658
See application file for complete search history.

(56) References Cited

U.S. PATENT DOCUMENTS

| | | | |
|---|---|---|---|
| 6,376,888 B1 | 4/2002 | Tsunashima et al. | |
| 6,784,508 B2 | 8/2004 | Tsunashima et al. | |
| 7,229,873 B2 | 6/2007 | Colombo et al. | |
| 2002/0058374 A1 | 5/2002 | Kim et al. | |
| 2004/0087070 A1 | 5/2004 | Nakajima | |
| 2006/0084217 A1* | 4/2006 | Luo et al. | 438/199 |
| 2010/0244141 A1* | 9/2010 | Beyer et al. | 257/369 |

FOREIGN PATENT DOCUMENTS

| | | |
|---|---|---|
| KR | 10-2001-0020803 A | 3/2001 |
| KR | 10-2001-0088450 A | 9/2001 |

* cited by examiner

*Primary Examiner* — Yu-Hsi D Sun
(74) *Attorney, Agent, or Firm* — Slater & Matsil, L.L.P.

(57) ABSTRACT

A method includes forming a PMOS device. The method includes forming a gate dielectric layer over a semiconductor substrate and in a PMOS region, forming a first metal-containing layer over the gate dielectric layer and in the PMOS region, performing a treatment on the first metal-containing layer in the PMOS region using an oxygen-containing process gas, and forming a second metal-containing layer over the first metal-containing layer and in the PMOS region. The second metal-containing layer has a work function lower than a mid-gap work function of silicon. The first metal-containing layer and the second metal-containing layer form a gate of the PMOS device.

13 Claims, 12 Drawing Sheets

CMOS DEVICES WITH METAL GATES AND METHODS FOR FORMING THE SAME

BACKGROUND

Metal-Oxide-Semiconductor (MOS) devices are basic building elements in integrated circuits. An existing MOS device typically has a gate electrode comprising polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used, which may be formed using a gate-last approach.

The gate-last approach typically includes the steps of forming dummy gates for both PMOS and NMOS devices. The dummy gates of PMOS and NMOS devices are then removed, and metals with different work functions are filled into the openings left by the dummy gates of the PMOS and NMOS devices.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Complementary Metal-Oxide-Semiconductor (CMOS) devices and the methods of forming the same are provided in accordance with various embodiments. The intermediate stages of forming the CMOS devices are illustrated. The variations of the embodiments are discussed. Throughout the various views and illustrative embodiments, like reference numbers are used to designate like elements.

Figure 1:
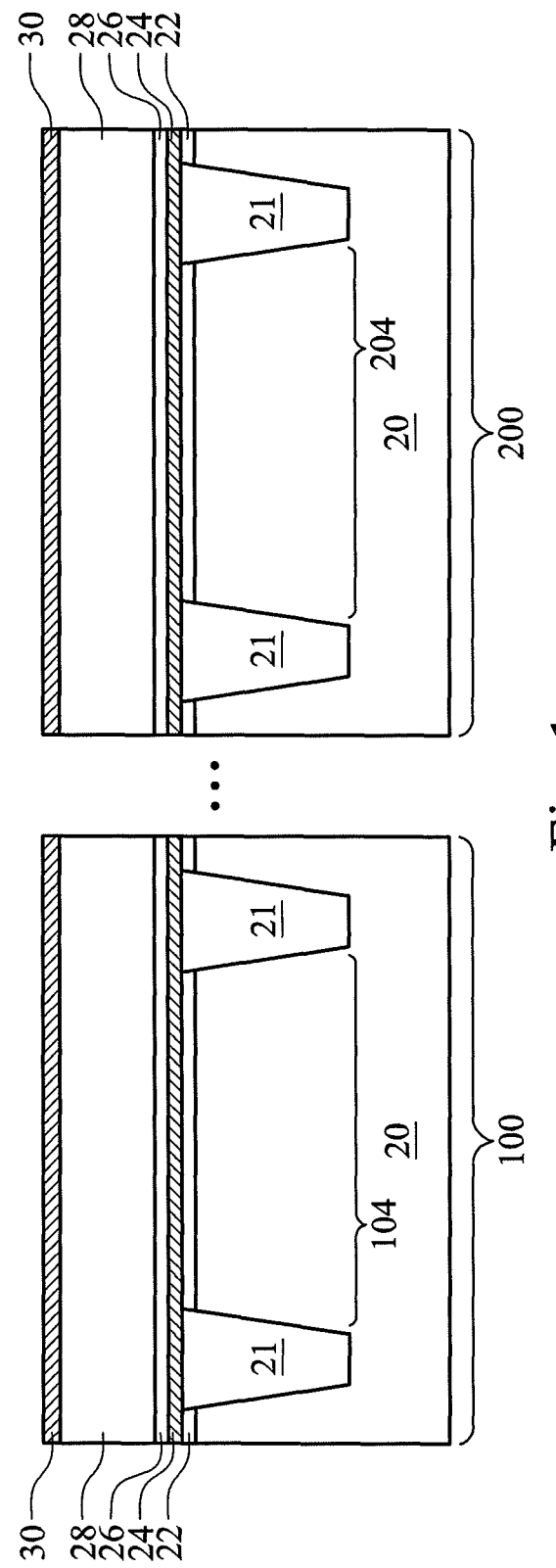
FIGS. 1 through 10 are cross-sectional views of intermediate stages in the manufacturing of Complementary Metal-Oxide-Semiconductor (CMOS) devices in accordance with some exemplary embodiments.

FIGS. 1 through 10 are cross-sectional views of intermediate stages in the manufacturing of CMOS devices in accordance with some exemplary embodiments. Referring to FIG. 1, substrate 20 is provided, which may be formed of a semiconductor material such as silicon, silicon-germanium (SiGe), and the like. Shallow trench isolation regions 21 are formed in substrate 20, and may be used to define active regions 104 and 204. Active region 104 is in N-type Metal-Oxide-Semiconductor (NMOS) region 100. Active region 204 is in P-type Metal-Oxide-Semiconductor (PMOS) region 200. Interfacial layer 22 is formed on substrate 20. Interfacial layer 22 may comprise a chemical oxide, a thermal oxide, silicon oxynitride, and the like, and may be formed by oxidizing substrate 20.

Layers 24, 26, 28 and 30 are then formed, and extend into NMOS region 100 and PMOS region 200. Dielectric layer 24 is formed on interfacial layer 22. In accordance with some embodiments, dielectric layer 24 comprises silicon oxide, silicon nitride, or multilayers thereof. In alternative embodiments, dielectric layer 24 is formed of a high-k dielectric material, and hence is alternatively referred to as high-k dielectric layer 24 throughout the description. High-k dielectric layer 24 may have a k value greater than about 7.0, and may include a metal oxide or a silicate of Hf, Al, Zr, La, Mg, Ba, Ti, Pb, and combinations thereof. Exemplary materials include $MgO_x$, $BaTi_xO_y$, $BaSr_xTi_yO_z$, $PbTi_xO_y$, $PbZr_xTi_yO_z$, and the like, with values X and Y being between 0 and 1. The thickness of high-k dielectric layer 24 may be between about 1 nm and about 10 nm. One skilled in the art will realize, however, that the dimensions recited throughout the specification are examples, and may be changed to different values. The formation methods of dielectric layer 24 may include Molecular-Beam Deposition (MBD), Atomic Layer Deposition (ALD), Physical Vapor Deposition (PVD), and the like.

Over dielectric layer 24, mid-gap metal-containing layer 26 is formed. In some embodiments, mid-gap metal-containing layer 26 has a mid-gap work function, which may be close to the mid-level of the conduction and valence bands of silicon. The conduction band and the valence band of silicon are 5.17 eV and 4.05 eV, respectively. Accordingly, the mid-level of the conduction band and the valence band of silicon is about 4.6 eV. In some embodiments, the mid-gap work function of mid-gap metal-containing layer 26 is between about 4.5 eV and about 4.7 eV. In some exemplary embodiments, mid-gap metal-containing layer 26 comprises titanium nitride (TiN). In alternative embodiments, the exemplary materials of mid-gap metal-containing layer 26 include tantalum-containing materials and/or titanium-containing materials such as TaC, TaN, TaAlN, TaSiN, TaCN, and combinations thereof.

Dummy polysilicon layer 28 and hard mask layer 30 are sequentially formed. Dummy polysilicon layer 28 may have a thickness between about 30 nm and about 100 nm, although different thicknesses may be used. Hard mask layer 30 may comprise dielectric materials such as silicon nitride, silicon oxide, silicon oxynitride, silicon carbide, and/or the like.

Figure 2:
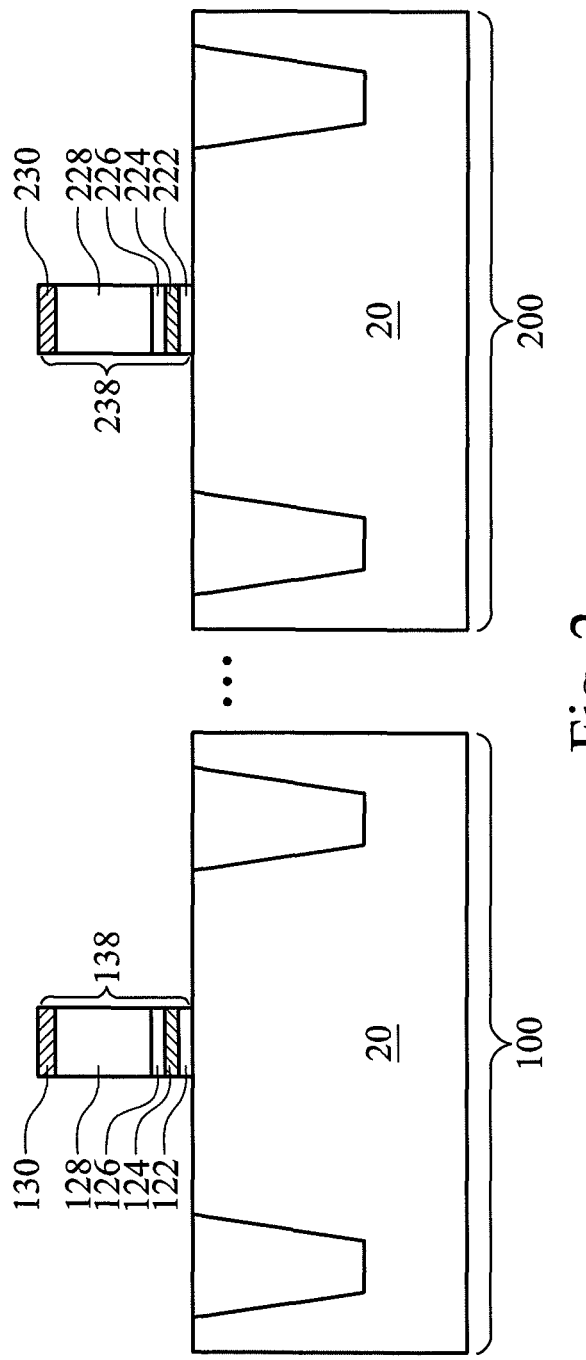

FIG. 2 illustrates the patterning of the stacked layers in FIG. 1. As a result, gate stack 138 is formed in NMOS region 100, and gate stack 238 is formed in PMOS region 200, wherein the layers in gate stacks 138 and 238 are remaining portions of the corresponding layers in FIG. 1. Gate stack 138 includes interfacial layer 122, dielectric layer 124, mid-gap metal-containing layer 126, dummy polysilicon layer 128, and hard mask layer 130. Gate stack 238 includes interfacial layer 222, dielectric layer 224, mid-gap metal-containing layer 226, dummy polysilicon layer 228, and hard mask layer 230.

Figure 3:
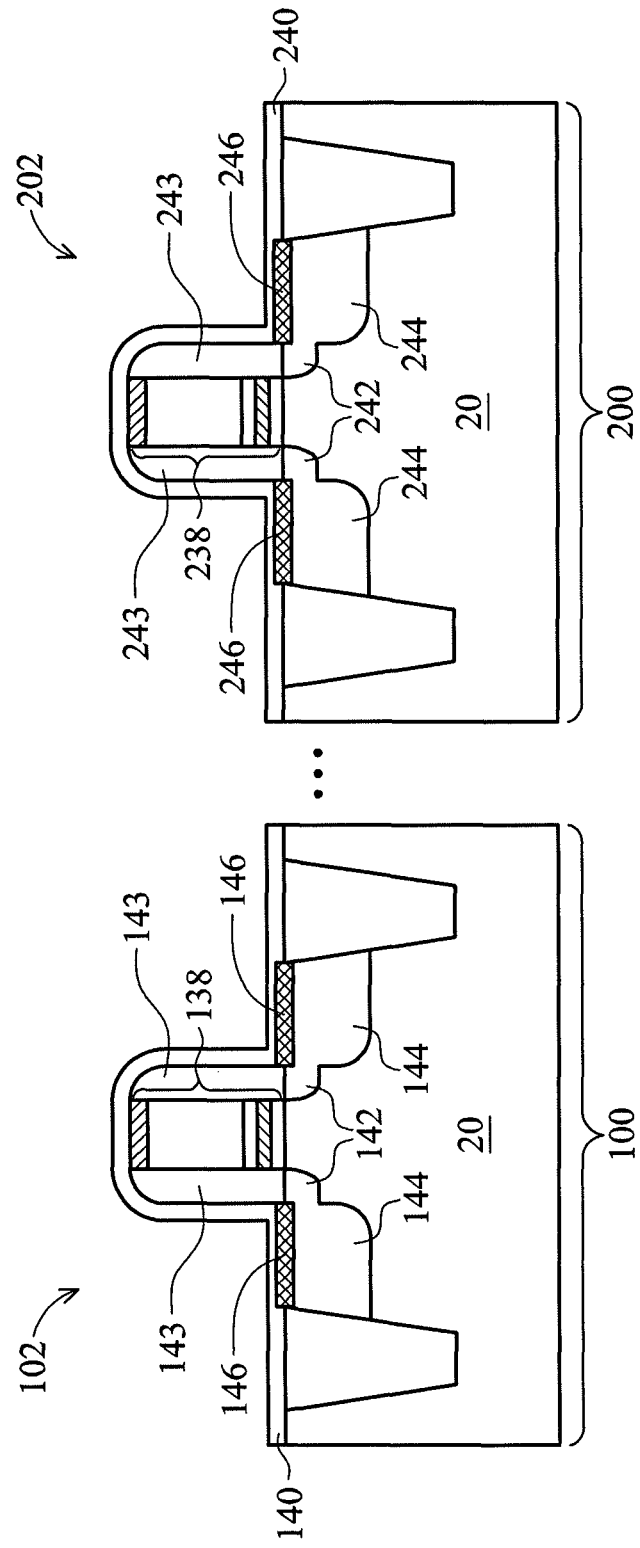

FIG. 3 illustrates the formation of some components of NMOS device 102 and PMOS device 202 in NMOS region 100 and PMOS region 200, respectively. The components may include source/drain extension regions 142 and 242, gate spacers 143 and 243, source/drain regions 144 and 244, and source/drain silicides 146 and 246. Contact Etch Stop Layer (CESL) 140, which may have a tensile stress, is formed over NMOS device 102. CESL 240, which may have a compressive stress, is formed over PMOS device 202. PMOS device 202 may further include stressors (not shown) that may be formed of silicon germanium, wherein source and drain regions 144 may be formed in the stressors.

Figure 4:
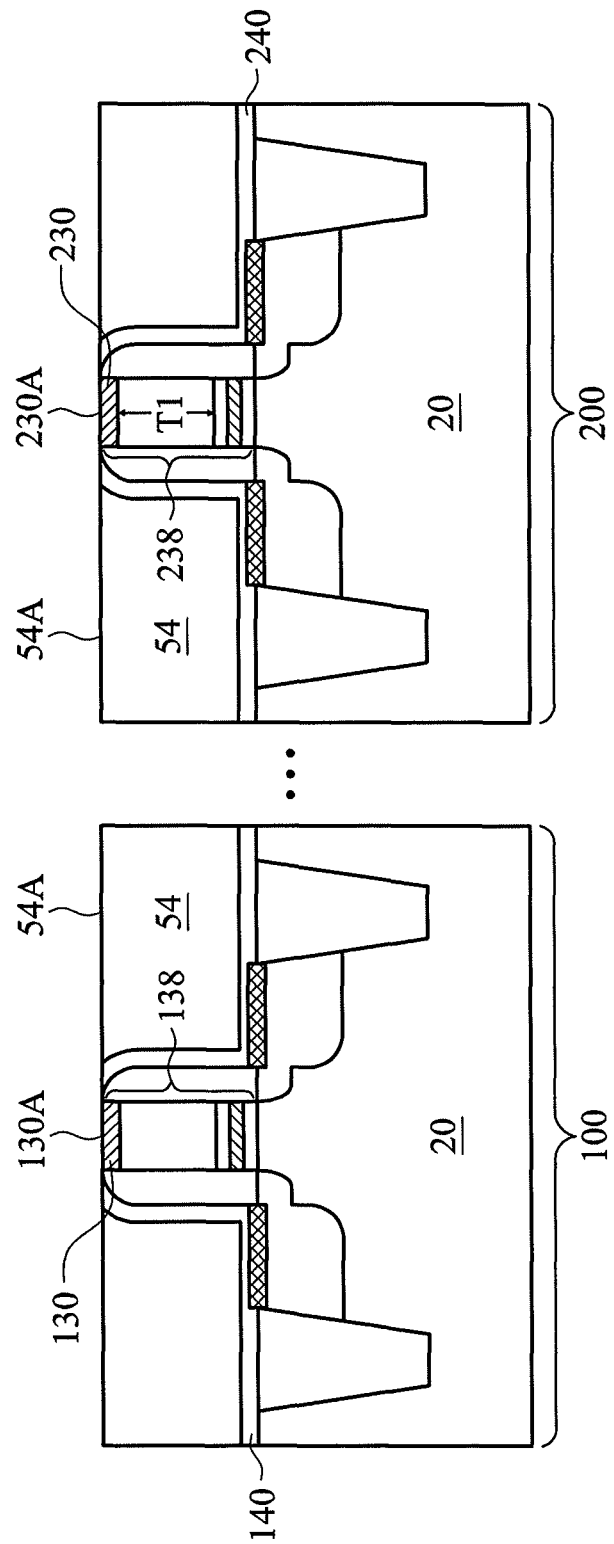

In FIG. 4, Inter-Layer Dielectric (ILD) 54 is first blanket formed to a height higher than the top surface of hard mask layers 130 and 230. In some embodiments, ILD 54 may include carbon-containing oxides. A Chemical Mechanical Polish (CMP) is then performed to remove excess ILD 54, so that the top surface 54A of ILD 54 is level with top surfaces 130A and 230A of hard mask layers 130 and 230, respectively.

Figure 5:
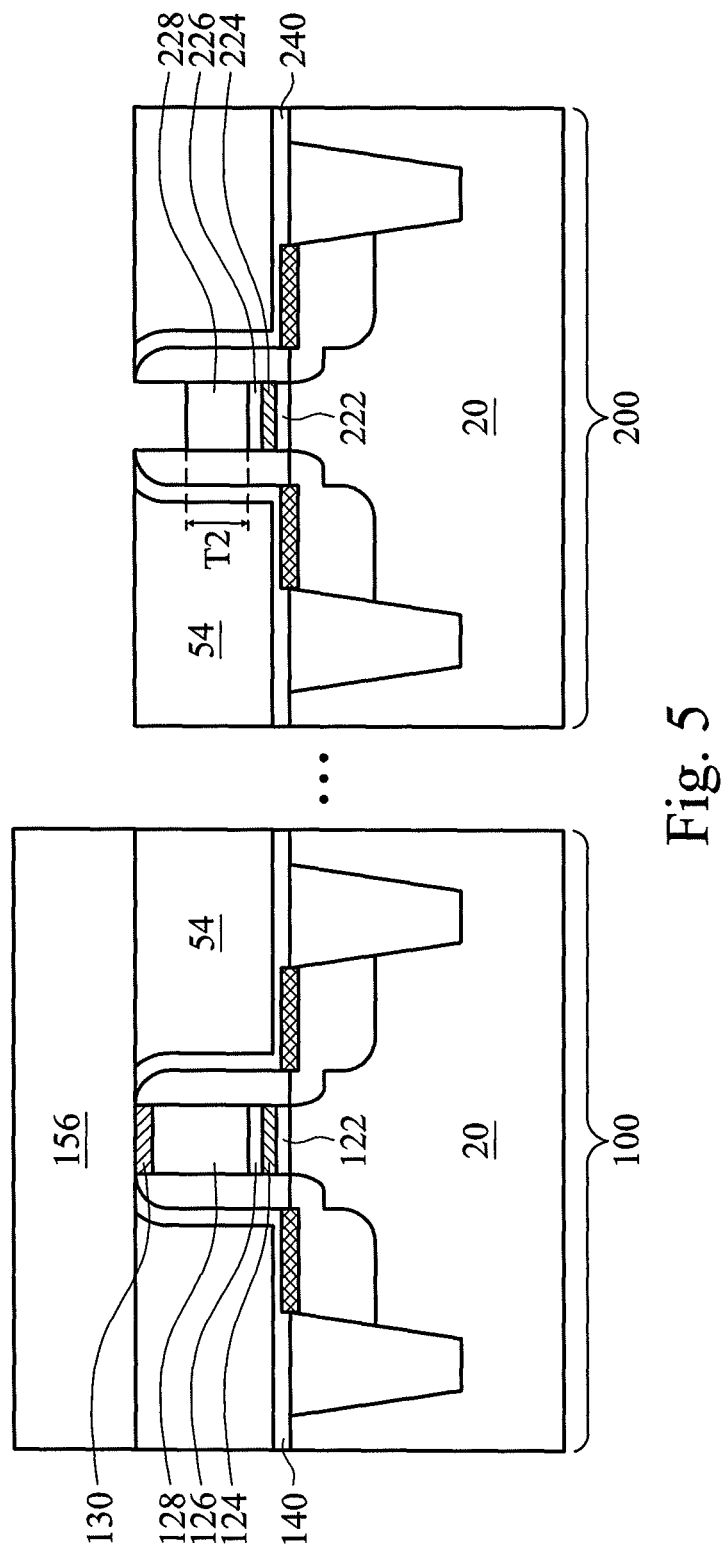

FIG. 5 illustrates the selective removal of hard mask layer 230 and an upper portion of dummy polysilicon layer 228, and a lower portion of dummy polysilicon layer 228 is not removed. In some embodiments, photo resist 156 is formed to cover NMOS region 100. The removal of hard mask layer 230 may be performed using diluted HF. The removal of the upper portion of polysilicon layer 228 may be performed using either dry or wet etching. In the case dry etching is used, the process gas may include $CF_4$, $CHF_3$, $NF_3$, $Br_2$, HBr, $Cl_2$, or combinations thereof.

In some embodiments, thickness T2 of the remaining dummy polysilicon layer 228 may be between about a third and about a half of the thickness T1 (FIG. 4) of dummy polysilicon layer 128 before its removal, although thickness T2 may be greater or smaller. In some embodiments, thickness T2 is less than about 300 nm, and may be between about 200 nm and about 300 nm. After the etching of dummy gate polysilicon layer 228, photo resist 156 is removed.

Figure 6:
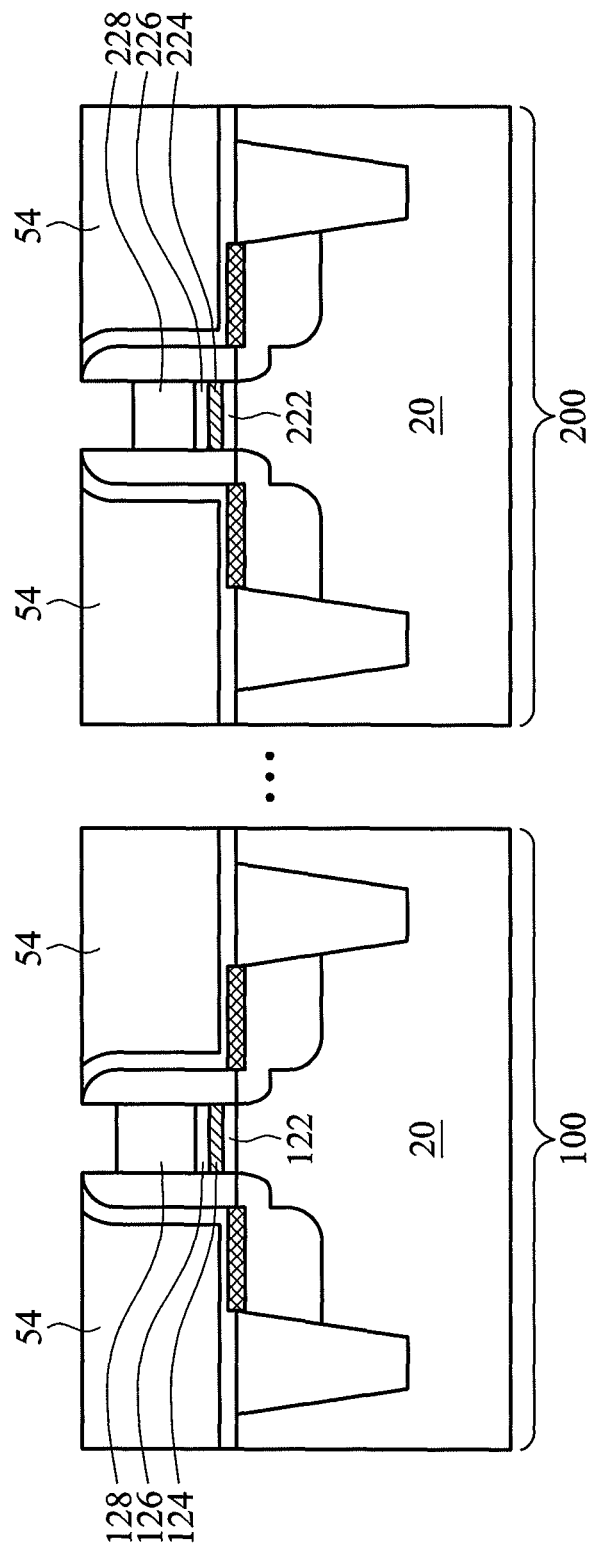

FIG. 6 illustrates the removal of hard mask layer 130 in NMOS region 100. In some embodiments, no photo resist is formed for the removal of hard mask layer 130, although a photo resist may also be formed to cover PMOS region 200. The etchant for removing hard mask layer 130 is selected so that the etchant attacks hard mask layer 130, while dummy polysilicon layers 128 and 228 are substantially not etched.

Figure 7:
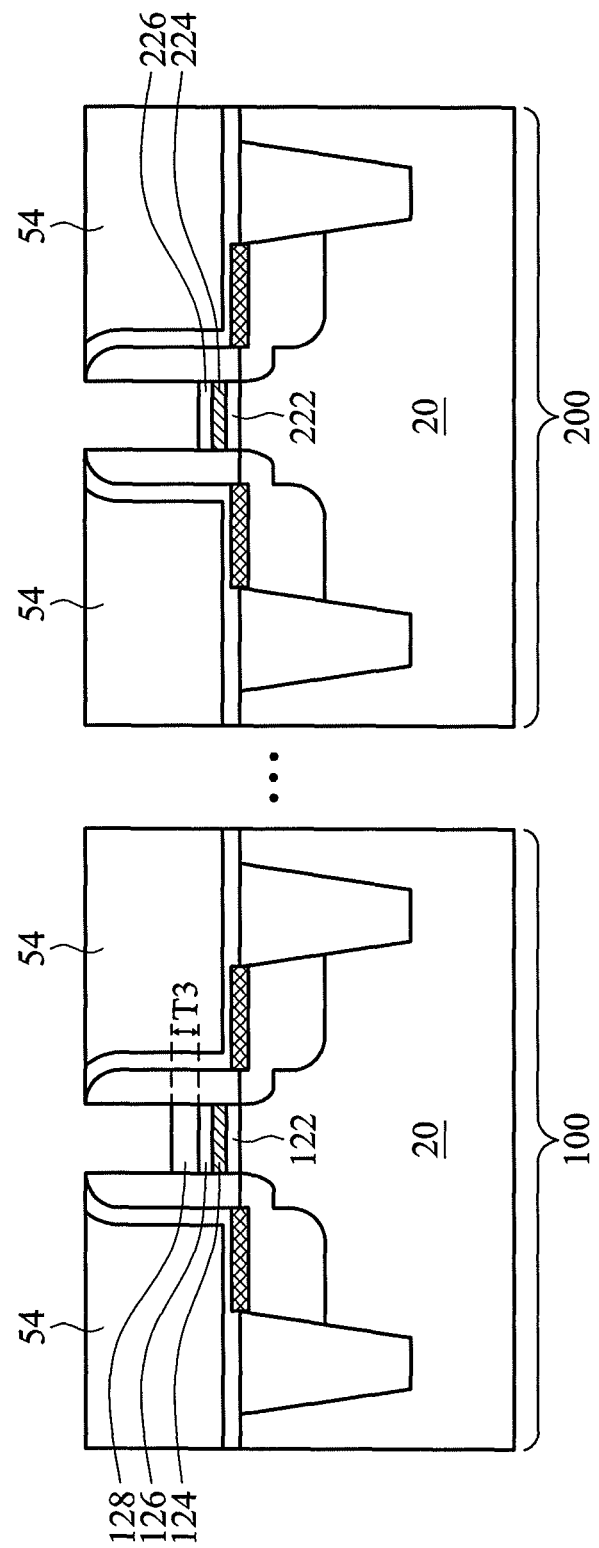

Referring to FIG. 7, dummy polysilicon layers 128 and 228 are etched simultaneously, until mid-gap metal-containing layer 226 is exposed. The upper portion of dummy polysilicon layer 128 is also etched, and a lower portion of dummy polysilicon layer 128 still remains to cover mid-gap metal-containing layer 126. The etchant is selected so that the etchant does not substantially etch mid-gap metal-containing layer 226 after it is exposed. In some embodiments, thickness T3 of dummy polysilicon layer 128 is greater than about 200 nm, for example. Thickness T3 may also be between about one third and about a half thickness T1 (FIG. 4).

After the exposure of mid-gap metal-containing layer 226, a treatment is performed on mid-gap metal-containing layer 226 using an oxygen-containing process gas. The oxygen-containing process gas may include oxygen ($O_2$), ozone, or the like. Carrier gases such as nitrogen ($N_2$), hydrogen ($H_2$), or the like may also be used. In some embodiments, the volume ratio of oxygen in the oxygen-containing process gas process gas may be greater than about 10 percent, greater than about 25 percent, or greater than about 50 percent. The oxygen-containing process gas may also be pure oxygen.

The treatment may be performed using a plasma treatment. In some exemplary embodiments, the power for the treatment is between about 200 watts and about 1,000 watts. The pressure of the oxygen-containing process gas may be between about 2 mTorr and about 5 mTorr. The bias power may be smaller than about 50 watts. The treatment duration may be between about 5 seconds and about 60 seconds.

During the treatment, since dummy polysilicon layer 128 remains on the top of mid-gap metal-containing layer 126, mid-gap metal-containing layer 126 is not treated, and its work function does not change. Due to the treatment, the work function of mid-gap metal-containing layer 226 is increased, for example, from a mid-gap work function to closer to the valence band of silicon. In some embodiments, the work function of mid-gap metal-containing layer 226 may be increased by about 0.5 eV or more through the treatment. Accordingly, in some exemplary embodiments, metal-containing layer 226 may no longer be a mid-gap metal-containing layer. After the treatment, the work function of metal-containing layer 226 may be greater than the work function of mid-gap metal-containing layer 126, for example, by about 0.5 eV, although metal-containing layers 126 and 226 are initially formed of a same material. In addition, due to the treatment, metal-containing layer 226 may contain more oxygen than mid-gap metal-containing layer 126.

Figure 8:
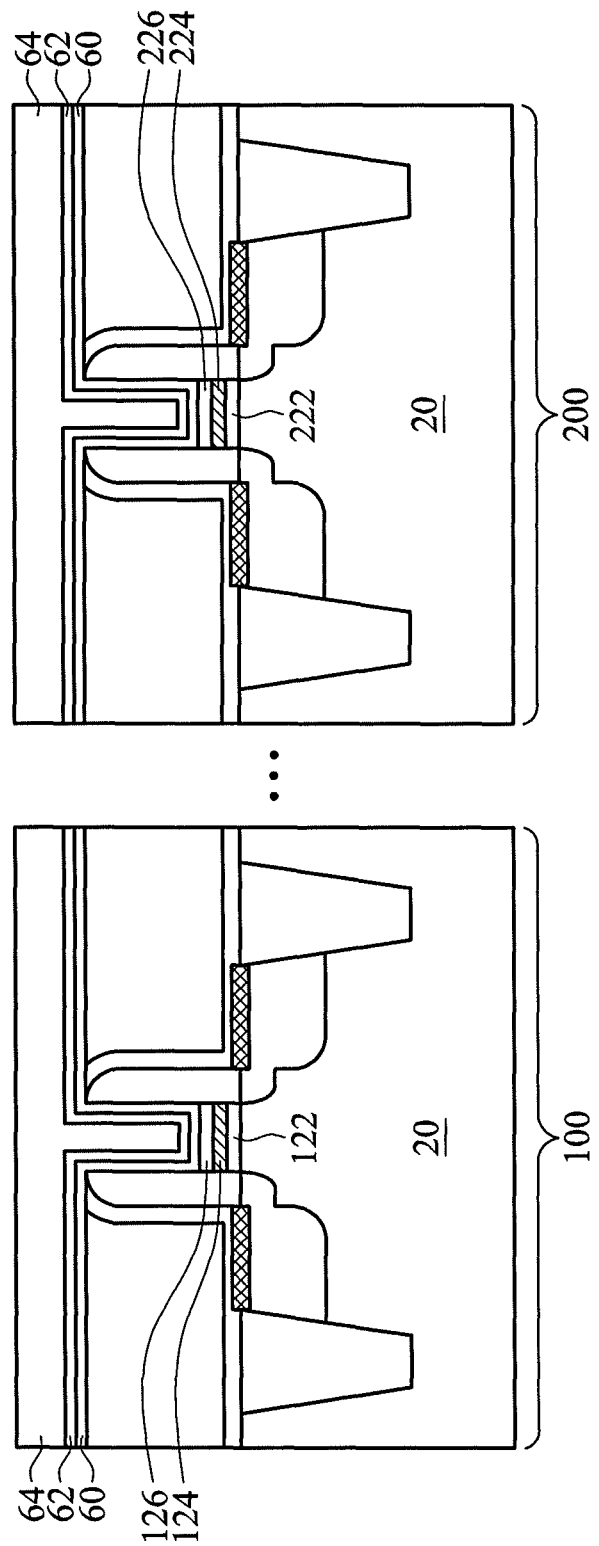

After the treatment, dummy polysilicon layer 128 is removed. The resulting trenches left by dummy polysilicon layers 128 and 228 are then filled, as shown in FIG. 8. The filling metal-containing layers may have an overall work function lower than the mid-gap work function of silicon. In some embodiments, tantalum nitride layer 60 is first filled, followed by the formation of metal-containing layer 62. The work function of metal-containing layer 62 may be higher than about 4.1 eV, for example. The exemplary materials of metal layer 62 include TaC, TiAl, Ti, TiAlN, TaSiN, TaCN, combinations thereof, and multilayers thereof. In an exemplary embodiment, metal layer 62 includes a TiAl layer, a TaN layer over the TiAl layer, and a TiN layer over the TaN layer. The remaining trenches may be filled by a filling metal such as aluminum, which is shown as metal layer 64.

Figure 9:
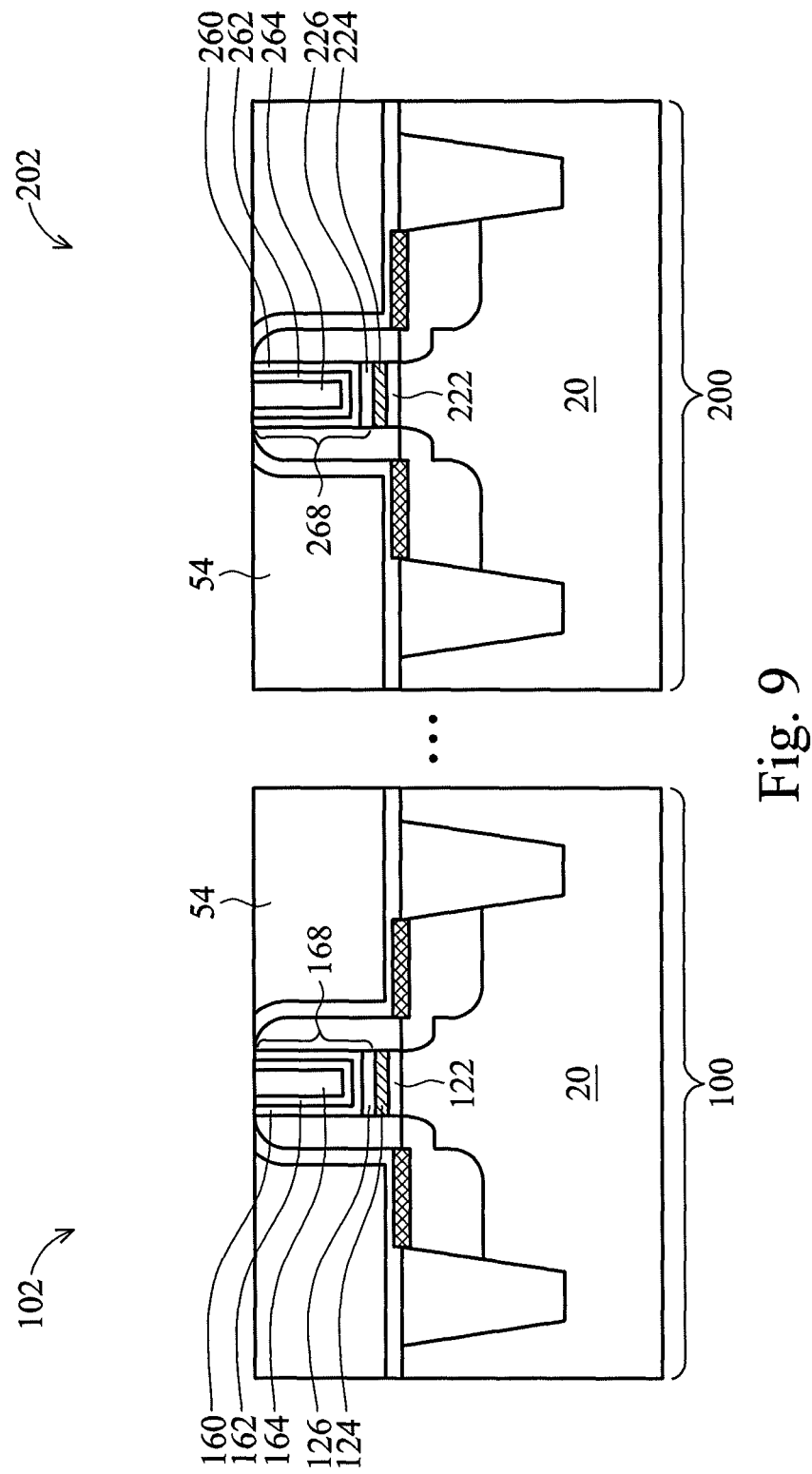
Figure 10:
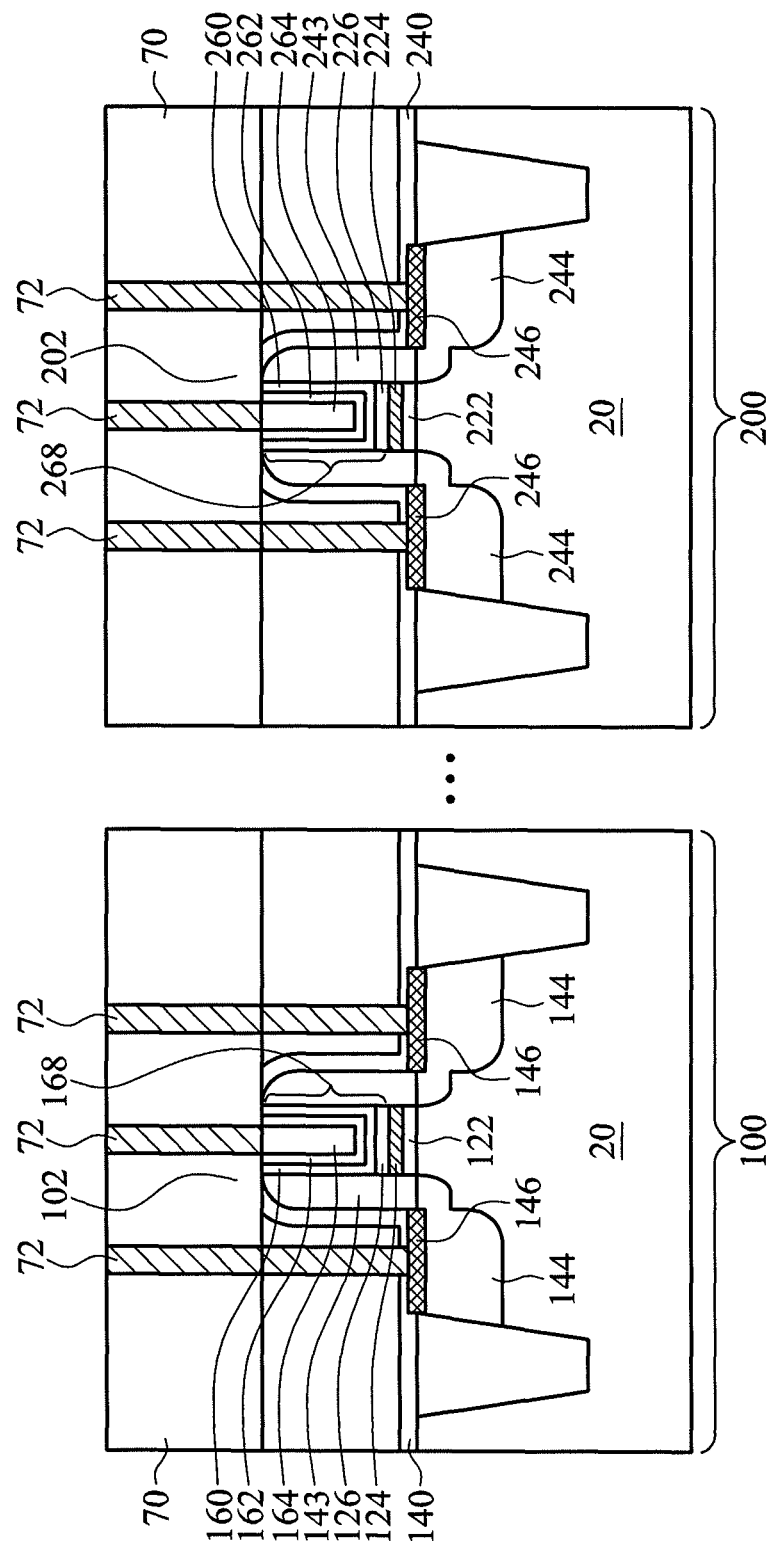

Referring to FIG. 9, A CMP is performed to remove the excess metal, so that the top surfaces of metal layers 60/62/64 are level with the top surface of ILD 54. The remaining portions of metal layers are denoted as 160 and 260, 162 and 262, and 164 and 264. The replacement gate 168 of NMOS device 102 and the replacement gate 268 of PMOS device 202 are thus formed, wherein replacement gate 168 includes layers 126, 160, 162 and 164, and replacement gate 268 includes layers 226, 260, 262 and 264. FIG. 10 illustrates a structure after the formation of ILD 70 and contact plugs 72. The formation of NMOS device 102 and PMOS device 202 is thus finished.

In the resulting NMOS device 102, replacement gate 168 includes low work-function metal layers (such as layer 162) over mid-gap metal-containing layer 126. The resulting gate 168 thus has a low work function, which is suitable for the NMOS device 102, which prefers a low work function. In PMOS device 202, on the other hand, replacement gate 268 includes low work-function metal layers (such as 262) over high work-function metal-containing layer 226. Due to the existence of high work-function metal-containing layer 226, the resulting gate 268 has a higher work function than gate 168. The work function of gate 268 is thus suitable for PMOS device 202 that prefers a high work function.

Figure 11:
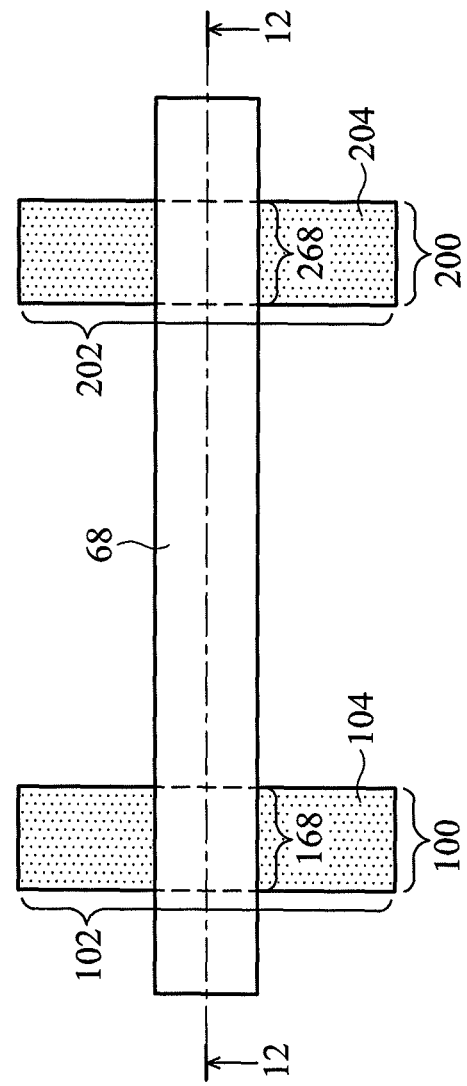
FIG. 11 illustrates a top view of a p-type Metal-Oxide-Semiconductor (PMOS) device and an n-type Metal-Oxide-Semiconductor (PMOS) device in accordance with some exemplary embodiments, wherein the gates of the PMOS device and the NMOS device are portions of a continuous gate strip.
Figure 12:
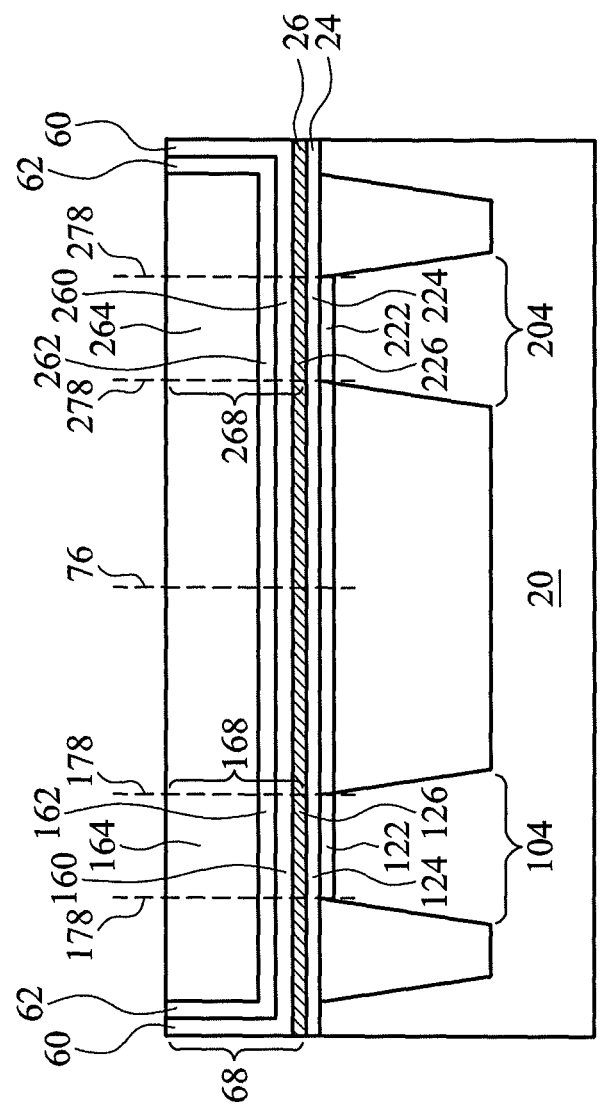
FIG. 12 illustrates a cross-sectional view of the devices shown in FIG. 11 in accordance with some exemplary embodiments.

FIGS. 11 and 12 illustrate an exemplary top view and an exemplary cross-sectional view, respectively, of NMOS device 102 and PMOS device 202 accordance with some embodiments. In the embodiments in FIGS. 11 and 12, the gates of NMOS device 102 and PMOS device 202 are connected as a continuous gate strip. It is appreciated that the embodiments in FIGS. 11 and 12 are exemplary, and replacement gates 168 and 268 in FIG. 10 may not be connected in alternative embodiments. Referring to FIG. 11, gates 168 and 268 are portions of a same metal gate strip 68 that extends from over active region 104 of NMOS device 102 to over active region 204 of PMOS device 202. As shown in FIG. 12, gates 168 and 268 may have essentially the same structure. Each of the layers in gate 168 may have a corresponding layer in gate 268, wherein the corresponding layers in gates 168 and 268 are formed of essentially a same material, and have essentially a same thickness, except layer 226 may have a higher oxygen concentration than layer 126. Similarly, each of the layers in gate 268 may have a corresponding layer in gate 168, wherein the corresponding layers in gates 168 and 268 are formed of essentially a same material, and have essentially a same thickness, except layer 226 may have a higher oxygen concentration than layer 126. In addition, PMOS device 202 includes a low work-function layer (such as layer 262 in FIG. 10) over metal-containing layer 226.

As shown in FIG. 12, the metal layers that form gates 168 and 268 extend continuously from over active region 104 to over active region 204. Lines 178 are drawn to mark the boundaries of gate 168. Lines 278 are drawn to mark the boundaries of gate 268. It is noted that between gates 168 and 268, gate strip 68 may not have any noticeable interface that extends in the direction shown by line 76 in FIG. 12. This is due to the fact that all layers in the metal gates 168 and 268 may be deposited using the same deposition processes. As a comparison, in conventional devices, between the gates of the existing PMOS and NMOS devices that share a same gate strip, there may be noticeable interfaces, for example, due to the fact that PMOS and NMOS devices use different metals to form their gates.

Experiment results indicated that the treatment may significantly improve the performance of PMOS devices that are formed using low work-function metals. For example, in an experiment, a first, a second, a third, and a fourth sample PMOS device was made. The first sample PMOS device includes a TiN layer that is not treated. The second sample PMOS device includes a TiN layer that is treated with oxygen ($O_2$) having a volume percent of 10 percent. The remaining 90 percent of the process gas are carrier gases. The third sample PMOS device includes a TiN layer that is treated with oxygen ($O_2$) having a volume percent of 25 percent. The remaining 75 percent of the process gas are carrier gases. The fourth sample PMOS device includes a TiN layer that is treated with oxygen ($O_2$) having a volume percent of 100 percent. It was found that the saturation threshold voltage of the second sample is lower than that of the first sample by about 50 mV. The saturation threshold voltage of the third sample is lower than that of the first sample by about 100 mV. The saturation threshold voltage of the fourth sample is lower than that of the first sample by about 150 mV. Similarly, the linear threshold voltages of the second, the third, and the fourth samples are also significantly lower than that of the first sample, and the second, the third, and the fourth sample having increasingly smaller linear threshold voltages. These results indicate the significant performance improvement of the PMOS devices due to the treatment. Furthermore, the results also indicate that the adjustment of the performance of PMOS devices may be achieved by adjusting the treatment conditions such as the percentage of oxygen in the process gas for the treatment.

In accordance with embodiments, a method includes forming a PMOS device. The method includes forming a gate dielectric layer over a semiconductor substrate and in a PMOS region, forming a first metal-containing layer over the gate dielectric layer and in the PMOS region, performing a treatment on the first metal-containing layer in the PMOS region using an oxygen-containing process gas, and forming a second metal-containing layer over the first metal-containing layer and in the PMOS region. The second metal-containing layer has a work function lower than a mid-gap work function of silicon. The first metal-containing layer and the second metal-containing layer form a gate of the PMOS device.

In accordance with other embodiments, a method includes forming a gate dielectric layer over a semiconductor substrate, wherein the gate dielectric layer includes a first portion in a PMOS region and a second portion in an NMOS region. A first metal-containing layer is formed over the gate dielectric layer, wherein the first metal-containing layer includes a first portion in the PMOS region and a second portion in the NMOS region. A dummy layer is formed over the first metal-containing layer, wherein the dummy layer includes a first portion in the PMOS region and a second portion in the NMOS region. The first portion of the dummy layer is removed to expose the first portion of the first metal-containing layer. A treatment is performed on the first portion of the first metal-containing layer. During the treatment, the second portion of the first metal-containing layer is covered by at least a lower portion of the second portion of the dummy layer. The at least the lower portion of the second portion of the dummy layer is removed. A second metal-containing layer is simultaneously filled into a first opening and a second opening, wherein the first opening is left by the removed first portion of the dummy layer, and the second opening is left by the removed second portion of the dummy layer.

In accordance with yet other embodiments, a PMOS device includes a gate dielectric layer over a semiconductor substrate, and a first metal-containing layer over the gate dielectric layer, wherein the first metal-containing layer comprises oxygen. The PMOS device further includes a second metal-containing layer over the first metal-containing layer, wherein the second metal-containing layer has a work function lower than a mid-gap work function of silicon.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure.

Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a P-type Metal-Oxide-Semiconductor (PMOS) device comprising:
      forming a gate dielectric layer over a semiconductor substrate and in a PMOS region;
      forming a first metal-containing layer over the gate dielectric layer and in the PMOS region;
      performing a treatment on the first metal-containing layer in the PMOS region using an oxygen-containing process gas, wherein during the treatment, the first metal-containing layer in the PMOS region is exposed to the oxygen-containing process gas; and
      forming a second metal-containing layer over the first metal-containing layer and in the PMOS region, wherein the second metal-containing layer has a work function lower than a mid-gap work function of silicon, and wherein the first metal-containing layer and the second metal-containing layer form a gate of the PMOS device; and
   forming an n-type Metal-Oxide-Semiconductor (NMOS) device comprising:
      when the step of forming the first metal-containing layer in the PMOS region is performed, simultaneously forming the first metal-containing layer in the NMOS region; and
      masking the first metal-containing layer in the NMOS region to avoid treating the first metal-containing layer in the NMOS region when the treatment on the first metal-containing layer in the PMOS region is performed, wherein the masking the first metal-containing layer in the NMOS region comprises:
         forming a polysilicon layer comprising a first portion over a first portion of the first metal-containing layer in the PMOS region and a second portion over a second portion of the first metal-containing layer in the NMOS region;
         removing a top portion of the first portion of the polysilicon layer, wherein the second portion of the polysilicon layer is protected from the removing; and
         simultaneously etching the second portion of the polysilicon layer and remaining first portion of the polysilicon layer to fully remove the first portion of the polysilicon layer, with a bottom portion of the second portion of the polysilicon layer remaining when the treatment is performed.

2. The method of claim 1, wherein the first metal-containing layer has a work function close to the mid-gap work function of silicon.

3. The method of claim 2, wherein the first metal-containing layer comprises titanium nitride.

4. The method of claim 1, wherein the forming the NMOS device further comprises:
   when the step of forming the gate dielectric layer in the PMOS region is performed, simultaneously forming the gate dielectric layer in an NMOS region; and
   when the step of forming the second metal-containing layer in the PMOS region is performed, simultaneously forming the second metal-containing layer in the NMOS region, wherein a gate of the NMOS device comprises the first metal-containing layer and the second metal-containing layer.

5. The method of claim 1 further comprising:
   after the step of forming the first metal-containing layer, forming a dummy layer over the first metal-containing layer, wherein the dummy layer extends into the PMOS region and the NMOS region;
   before the step of performing the treatment, removing the dummy layer from the PMOS region, wherein a portion of the dummy layer in the NMOS region is not removed during the treatment; and
   after the step of performing the treatment, removing the portion of the dummy layer in the NMOS region.

6. The method of claim 1, wherein the treatment comprises a plasma treatment.

7. The method of claim 1, wherein the oxygen-containing process gas comprises oxygen ($O_2$).

8. The method of claim 7, wherein the treatment is performed using substantially pure oxygen.

9. A method comprising:
   forming a gate dielectric layer over a semiconductor substrate, wherein the gate dielectric layer comprises a first portion in a P-type Metal-Oxide-Semiconductor (PMOS) region and a second portion in an N-type Metal-Oxide-Semiconductor (NMOS) region;
   forming a first metal-containing layer over the gate dielectric layer, wherein the first metal-containing layer comprises a first portion in the PMOS region and a second portion in the NMOS region;
   forming a dummy layer over the first metal-containing layer, wherein the dummy layer comprises a first portion in the PMOS region and a second portion in the NMOS region;
   removing the first portion of the dummy layer to expose the first portion of the first metal-containing layer, wherein the removing the first portion of the dummy layer to expose the first portion of the first metal-containing layer comprises:
      removing a top portion of the first portion of the dummy layer, wherein the second portion of the dummy layer is protected from the removing; and
      simultaneously etching the second portion of the dummy layer and remaining first portion of the dummy layer to fully remove the first portion of the dummy layer;
   performing a treatment on the first portion of the first metal-containing layer, wherein during the treatment, a bottom portion of the second portion of the dummy layer remains, and the second portion of the first metal-containing layer is covered by the bottom portion of the second portion of the dummy layer, and wherein the first portion of the first metal-containing layer is exposed to a process gas used for the treatment;
   removing the bottom portion of the second portion of the dummy layer; and
   simultaneously filling a second metal-containing layer into a first opening and a second opening, wherein the first opening is left by the removed first portion of the dummy layer, and the second opening is left by the removed second portion of the dummy layer.

10. The method of claim 9, wherein the treatment comprises a plasma treatment, and is performed using a process gas comprising oxygen, and wherein during the treatment, the first portion of the first metal-containing layer is exposed to the process gas.

11. The method of claim 10, wherein the treatment is performed using substantially pure oxygen.

12. The method of claim 9 further comprising:
removing an upper portion of the first portion of the dummy layer; and
before the treatment, simultaneously removing a lower portion of the first portion of the dummy layer and an upper portion of the second portion of the dummy layer, wherein the first portion of the first metal-containing metal layer is exposed, and wherein the second portion of the first metal-containing metal layer is not exposed.

13. The method of claim 9, wherein the first metal-containing layer has a work function close to a mid-gap work function of silicon, and wherein the second metal-containing layer has a work function lower than the mid-gap work function of silicon.

\* \* \* \* \*